United States Patent
Yamaguchi et al.

(10) Patent No.: US 7,350,297 B2
(45) Date of Patent: Apr. 1, 2008

(54) METHOD OF MANUFACTURING A WIRING SUBSTRATE

(75) Inventors: Naoko Yamaguchi, Yokohama (JP); Hideo Aoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/356,215

(22) Filed: Feb. 17, 2006

(65) Prior Publication Data

US 2006/0194031 A1    Aug. 31, 2006

(30) Foreign Application Priority Data

Feb. 18, 2005    (JP) .......................... P2005-042170

(51) Int. Cl.
*H01K 3/10*    (2006.01)

(52) U.S. Cl. ............... 29/852; 29/825; 29/829; 29/846; 29/853; 216/18; 216/52; 427/96.1; 427/97.2; 428/209

(58) Field of Classification Search .............. 29/852, 29/825, 829, 846, 853; 216/18, 52; 427/96.1, 427/97.2; 428/209
See application file for complete search history.

(56) References Cited

U.S. PATENT DOCUMENTS 4,950,173 A  *  8/1990  Minemura et al. ............ 439/82

| | | | |
|---|---|---|---|
| 5,049,244 A | | 9/1991 | Yarita et al. |
| 5,092,958 A | * | 3/1992 | Yarita et al. ............ 216/18 |
| 6,977,130 B2 | | 12/2005 | Aoki et al. |
| 2004/0197487 A1 | | 10/2004 | Aoki et al. |

FOREIGN PATENT DOCUMENTS

| | | |
|---|---|---|
| JP | 02-246193 | 10/1990 |
| JP | 07-263841 | 10/1995 |
| JP | 2004-048030 | 2/2004 |

* cited by examiner

*Primary Examiner*—Tim Phan
(74) *Attorney, Agent, or Firm*—Finnegan, Henderson, Farabow, Garrett & Dunner, L.L.P.

(57) ABSTRACT

A first plating foundation layer is formed by printing on a front face of a sheet-shaped insulating substrate. By inserting a punch into the sheet-shaped insulating substrate having the first plating foundation layer, a through hole is formed while leaving a piece having the plating foundation layer in the portion where the punch is inserted. A second plating foundation layer is formed by printing on a rear face of the sheet-shaped insulating substrate. A first and second wiring layers composed of a metal plating layer are formed by performing electroless plating, and at the same time, a metal plating layer connecting between the first and second wiring layers is formed in the through hole using the plating foundation layer on the piece.

5 Claims, 5 Drawing Sheets

METHOD OF MANUFACTURING A WIRING SUBSTRATE

CROSS-REFERENCE TO THE RELATED APPLICATIONS

This application is based upon and claims the benefit of priority from the prior Japanese Patent Applications No. 2005-042170, filed on Feb. 18, 2005; the entire contents of which are incorporated herein by reference.

BACKGROUND OF THE INVENTION

1. Field of the Invention

The present invention relates to a wiring substrate and a manufacturing method thereof.

2. Description of the Related Art

In recent years, when producing a wiring substrate on which parts such as a semiconductor element, a chip, and so forth are to be mounted, the application of printing methods represented by an electrophotographic method, a screen printing, and the like is under study, and their practical uses are in progress (refer to, for example, Japanese Patent Laid-Open Application No. Hei7-263841 and Japanese Patent Laid-Open Application No. 2004-048030). For instance, a plating foundation layer is formed on an insulating substrate by printing by applying the electrophotographic method or the like, and electroless plating is performed to the plating foundation layer thereafter, so that a wiring layer is formed. The wiring layer forming step as described above allows the sheet-shaped substrate such as a resin film to be used as an insulating substrate, having an advantage that a flexible wiring substrate can be obtained easily.

In order to put the flexible wiring substrate into practical use, it is required to form wiring layers on both front and rear faces of the sheet-shaped insulating substrate and also to connect between the wiring layers on both the front and rear faces electrically. As methods that electrically connect between the front and rear faces of the substrate, generally, those connecting by a through hole and by a via hole are known in general. These connecting methods have problems that they are forced to have complicated steps to connect both the faces, for example: a foundation layer forming step forming a foundation layer along the internal wall surface of the through hole or via hole by the electroless plating, a resist forming step required before forming the foundation layer, and the like.

The flexible wiring substrates produced by applying the electrophotographic method or the like have an advantage of low cost based on a simplified production process, reduced number of steps, or the like. However, when the general through-hole connection or the via-hole connection is applied to the connection of both the front and rear faces of the substrate, the production cost of the flexible wiring substrate increases due to the complicated steps and increased number of steps required for the connection as described above. In other words, the flexible wiring substrate applying the electrophotographic method or the like cannot receive the benefit of low cost due to the step of connecting between both the front and rear faces of the substrate.

Meanwhile, as a simple method of connecting both the faces, there is known one that forms a through hole in the sheet-shaped substrate using a press method and prints a conductive ink on the through-hole portion from both the faces of the substrate to closely attach the conductive ink entered into the through hole from both sides thereon to thereby electrically connect the wiring layers provided on both the faces of the sheet-shaped substrate (refer to, for example, Japanese Patent Laid-Open Application No. Hei 2-246193). However, this method has a limitation in view of reliability improvement or resistance reduction of the connecting portion, and so forth, in that the inside of the through hole is filled based simply on fluidity, viscosity, and the like of the conductive ink.

In U.S. Pat. No. 5,049,244, there is disclosed a method in which a pinhole is formed in an insulating film, a metal thin film is formed on both front and rear faces of the insulating film and also on an internal wall surface of the pinhole by deposition method or sputtering, and thereafter wiring patterns on both the front and rear faces and a connecting portion connecting these are formed by plating using the metal thin film as a plating foundation layer. Due to the deposition method or sputtering applied to the formation of the plating foundation layer, this method cannot avoid a cost increase in connecting both the faces, and in addition to that, the reliability and characteristics of the both-face connecting portion are easily degraded depending on the shape of the pinhole. Further, as in the conventional through-hole forming steps, a resist-layer forming and removing steps are required, having a problem that the step of connecting both the faces itself becomes complicated.

BRIEF SUMMARY OF THE INVENTION

An object of the present invention is to provide a wiring substrate with improved reliability and characteristics without losing characteristics such as low cost obtained by printing method by enabling a simple and highly reliable connection between both front and rear faces of the wiring substrate, and a manufacturing method thereof.

A wiring substrate according to an embodiment of the present invention comprises: a sheet-shaped insulating substrate having a front face and a rear face; a first plating foundation layer formed on the front face of the sheet-shaped insulating substrate in accordance with a wiring pattern and having a resin layer containing metal particulates; a first wiring layer formed on the first plating foundation layer and having a metal plating layer; a second plating foundation layer formed on the rear face of the sheet-shaped insulating substrate in accordance with a wiring pattern and having a resin layer containing metal particulates; a second wiring layer formed on the second plating foundation layer and having a metal plating layer; and a connecting portion connecting between the front and rear faces of the sheet-insulating substrate and having a through-hole formed to generate a cut in the sheet-shaped insulating substrate, a piece formed in a portion where the throuqh-hole is formed along the cut and apart of which is continued from the sheet-shaped insulating substrate, a plating foundation layer formed on at least both obverse and reverse of the piece, and a metal plating layer formed by using the plating foundation layer on the piece to connect between the first and second wiring layers.

A wiring substrate according to another embodiment of the present invention comprises: a sheet-shaped insulating substrate having a front face and a rear face; a first plating foundation layer formed on the front face of the sheet-shaped insulating substrate in accordance with a wiring pattern and having a resin layer containing metal particulates; a first wiring layer formed on the first plating foundation layer and having a metal plating layer; a second plating foundation layer formed on the rear face of the sheet-shaped insulating substrate in accordance with a wiring pattern and having a resin layer containing metal particulates; a second wiring layer formed on the second plating foundation layer and having a metal plating layer; and a connecting portion having a tilting through hole formed to connect the front and rear faces of the sheet-shaped insulating substrate, a plating foundation layer covering at least a part of an internal wall surface of the tilting through hole, and a metal plating layer formed by using the plating foundation layer on the internal wall surface of the tilting through hole to connect between the first and second wiring layers.

A manufacturing method of a wiring substrate according to still another embodiment of the present invention comprises: printing a first plating foundation layer on a front face of a sheet-shaped insulating substrate; forming a through hole connecting between the front face and rear face of the sheet-shaped insulating substrate by inserting a punch into the sheet-shaped insulating substrate having the first plating foundation layer to generate a cut in the sheet-shaped insulating layer while leaving a piece having the plating foundation layer and separated from the sheet-shaped insulating substrate along the cut while a part thereof is continued from the sheet-shaped insulating layer in a portion where the punch is inserted; printing a second plating foundation layer on the rear face of the sheet-shaped insulating substrate; and performing electroless plating to the plating foundation layers to form first and second wiring layers respectively composed of a metal plating layer on the first and second plating foundation layers, and to form a metal plating layer connecting between the first and second wiring layers in the through hole using the plating foundation layer on both obverse and reverse of the piece.

A manufacturing method of a wiring substrate according to still another embodiment of the present invention comprises: forming a tilting through hole in a sheet-shaped insulating substrate, the tilting through hole connecting between front and rear faces of the sheet-shaped substrate; printing first and second plating foundation layers sequentially on the front and rear faces of the sheet-shaped insulating substrate having the tilting through hole to cover at least a part of an internal wall surface of the tilting through hole with at least one of the first and second plating foundation layers; and performing electroless plating to the plating foundation layers to form first and second wireing layers respectively composed of a metal plating layer on the first and second plating foundation layers, and to form in the tilting through hole a metal plating layer connecting between the first and second wiring layers using the plating foundation layer on the internal wall surface of the tilting through hole.

DETAILED DESCRIPTION OF THE INVENTION

Hereinafter, modes to embody the present invention will be described with reference to the drawings. Note that embodiments of the present invention will be described with reference to the drawings hereinbelow, however, the drawings are given for the purpose only of illustration and the present invention is not limited thereto.

Figure 1A:
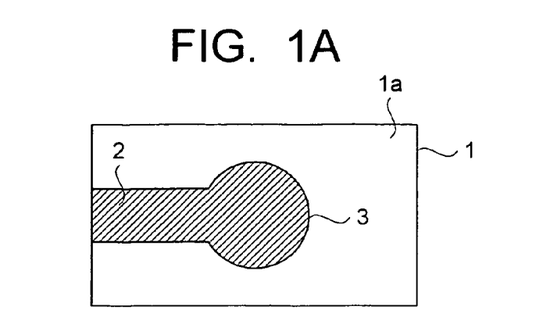
FIG. 1A, FIG. 1B, FIG. 1C, and FIG. 1D are plan views showing a production process of a wiring substrate according to a first embodiment of the present invention.
Figure 1B:
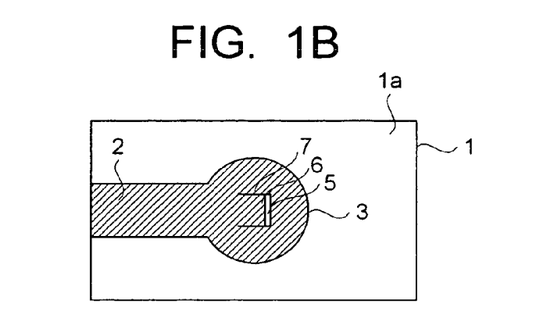
Figure 1C:
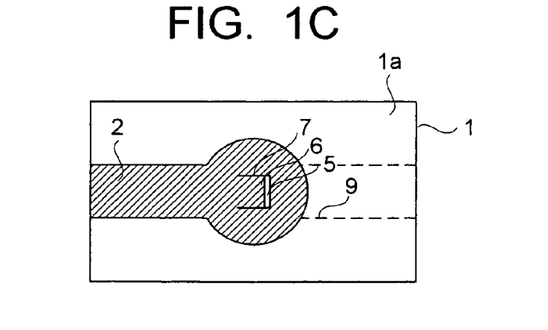
Figure 1D:
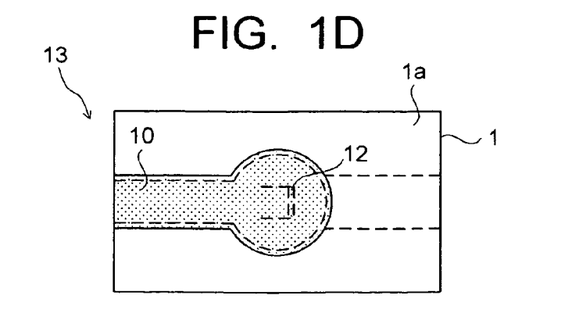
Figure 2A:
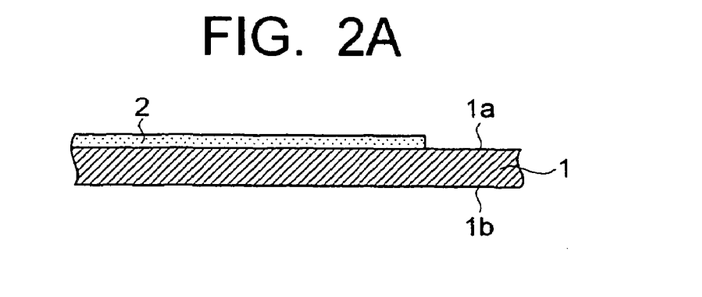
FIG. 2A, FIG. 2B, FIG. 2C and FIG. 2D are views showing the production process of the wiring substrate shown in FIG. 1A, FIG. 1B, FIG. 1C, and FIG. 1D on sections.

FIGS. 1A to 1D and FIGS. 2A to 2D are views showing a production process of a wiring substrate according to a first embodiment of the present invention, and FIGS. 1A to 1D are its plan views and FIGS. 2A to 2D are its sectional views. First, as shown in FIG. 1A and FIG. 2A, a first plating foundation layer 2 having a desired wiring pattern is formed by printing on a front face 1$a$ of a sheet-shaped insulating substrate 1. The first plating foundation layer 2 has a land 3 at a connecting portion with a rear face 1$b$ side.

As a sheet-shaped insulating substrate 1, various sheet-shaped members having insulation performance such as resin films including an epoxy resin film, polyimide resin film and PET resin film and glass-epoxy resin film; papers including a paper made of pulp, ceramic paper and fabric paper, and nonwoven fabrics made from various materials can be used.

The material of the sheet-shaped insulating substrate 1 is not specifically limited as long as it has insulation performance, however, the thickness is preferably 100 μm or below in view of reliability improvement in electrical connection by a later-described through hole connecting portion. When the thickness of the sheet-shaped insulating substrate 1 exceeds 100 μm, it is possibly unable to connect between both the front and rear faces with high reliability by a metal plating layer formed in the later-described through hole. Specifically, the reliability of electrical connection between both the front and rear faces by the metal plating layer in the through hole degrades. Preferably, the thickness of the sheet-shaped insulating substrate 1 is 10 μm or above for the purpose of keeping performance as an insulating substrate that forms the wiring layer. More preferably, the thickness of the sheet-shaped insulating substrate 1 is within the range from 20 to 80 μm.

A step of forming the first plating foundation layer 2 with respect to the sheet-shaped insulating substrate 1 is performed by printing method such as an offset printing, screen printing, ink-jet printing and electrophotographic printing (electrostatic printing). Of these, the electrophotographic method is superior in micropattern-forming performance and, at the same time, is capable of reducing the formation cost of the plating foundation layer by direct drawing and then the production cost of the wiring substrate as well. The plating foundation layer 2 is preferably formed by applying the electrophotographic method. The same applies to a later-described second plating foundation layer 9 formed on the rear face side of the sheet-shaped insulating substrate 1.

In the case of forming the first plating foundation layer 2 (and the second plating foundation layer 9) by applying the electrophotographic method, the insulating resin particles containing metal particulates are used as charged particles (toner). For the insulating resin particles composing the toner, for example, insulating thermosetting resin is used.

For the thermosetting resin as described above, for example, epoxy resin, silicon resin, polyimide resin, bismaleimide resin, cyanate-ester resin, benzocyclobutene resin, polybenzoxazole resin, butadiene resin, polycarbodiimide resin, polyurethane resin, or the like can be cited, and among others, the epoxy regin is preferable. The metal particulates to be contained in the insulating resin particles are preferably composed of Cu, Au, Ag, Pt, Pd, Ni or the like.

The first plating foundation layer 2 and the second plating foundation layer 9 formed using the insulating resin particles containing metal particulates become insulating resin layers containing metal particulates. The metal particulates existing in the insulating resign layer serves as plating catalysts. Parts of the metal particulates to serve as the plating catalysts are formed to be exposed from the insulating resin layer. In order to realize a condition as described above, it is possible to perform etching or the like to the insulating resin layer containing the metal particulates. An electrophotographic printing apparatus employed in the forming step of the plating foundation layers 2, 9, is composed mainly of a photoreceptor drum, electrifier, laser generating/scanning device, developing machine/transfer section, fixer, and the like. In the developing machine, the toner composed of the insulating resin particles containing metal particulates is accumulated.

The plating foundation layers 2, 9 are formed, for example, as described below. First, electric potential of the surface of the photoconductor drum is charged to a certain potential (for example, negative charge) with the electrifier while turning the photoreceptor drum. Subsequently, a laser beam is irradiated to the photoconductor drum from the laser scanner in accordance with image signals to remove the negative charges of the irradiated portion, so that an image of charges (electrostatic latent image) corresponding to a predetermined wiring pattern is formed on the surface of the photoconductor drum. Subsequently, the toner particles, namely the insulating resin particles containing metal particulates are supplied while they are in the charged state from the developing unit to attach to the electrostatic latent image on the photoconductor drum. Subsequently, a visible image formed on the surface of the photoconductor drum by the toner particles is electrostatically transferred onto the sheet-shaped insulating substrate 1 by the transfer section. Thus, the first plating foundation layer 2 having the desired wiring pattern is formed.

Figure 2B:
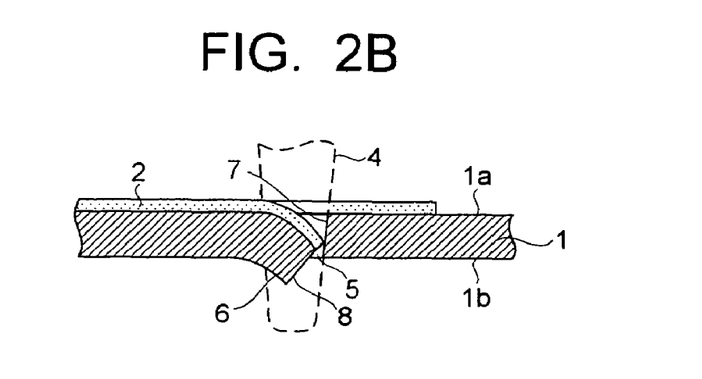

Subsequently, as shown in FIG. 1B and FIG. 2B, a through hole 5 is formed by inserting a punch 4 into the sheet-shaped insulating substrate 1 having the first plating foundation layer 2. The insertion of the punch 4 is performed to the land 3 of the first plating foundation layer 2. By inserting the punch 4 so that the punch 4 penetrates the sheet-shaped insulating substrate 1 including the first plating foundation layer 2, the through hole 5 connecting between both the front and rear faces of the sheet-shaped insulating substrate 1 is formed while leaving a piece 6 of the sheet-shaped insulating substrate 1 at a portion where the punch 4 is inserted (the portion where the through hole 5 is formed).

At this time, the punch 4 is inserted to generate a cut (cleft) 7 in the sheet-shaped insulating substrate 1. At the portion where the punch 4 is inserted (the portion where the through hole 5 is formed), the piece 6 separated from the sheet-shaped insulating substrate 1 and partly continued from the sheet-shaped insulating substrate 1 is formed along the cut 7. The piece 6 has a shape based on the cut 7, and has a side surface 8 along the cut 7. The piece 6 remains in a state of deforming in the inserting direction of the punch 4 with the plating foundation layer 2 existing on the surface thereof. By generating the cut (cleft) 7 in the sheet-shaped insulating substrate 1, the piece 6 can remain at the inserted portion of the punch 4 with high reproducibility.

The cut (cleft) 7 of the sheet-shaped insulating substrate 1 can be formed when inserting the punch 4 in accordance with the material and thickness of the sheet-shaped insulating substrate 1, the shape and inserting direction of the punch 4, and the like. The cut 7 maybe formed in the sheet-shaped insulating substrate 1 in advance.

The piece 6 of the sheet-shaped insulating substrate 1 having the plating foundation layer 2 is to connect between metal plating layers on the front and rear faces at the inside of the through hole 5 when a later-described electroless plating is performed. The shape of the piece 6 having a function as described above may be any shape as long as it is deformed in the inserting direction of the punch 4 so that a part thereof exists in the through hole 5. Although the concrete shape of the piece 6 is not specifically limited, however, concerning the deformed amount of the piece 6 into the through hole 5, assured connection by the through hole 5 can be realized by making the distance between the first plating foundation layer 2 and the second plating foundation layer 9 close to each other such that the metal plating layers on the front and rear faces are unified after the plating. The assured connection can be obtained, preferably, when the distance is the sum of the thicknesses of the metal layers on the front and rear faces or below. More preferably, although not necessarily, the through hole 5 is filled with the plating layers.

Figure 3:
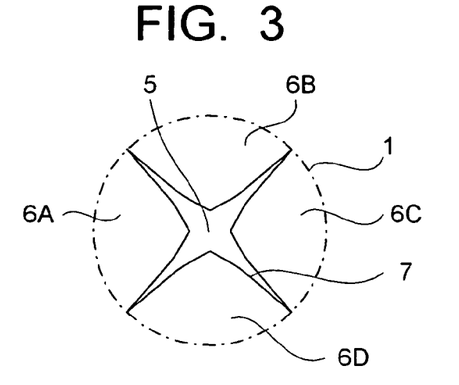
FIG. 3 is a plan view showing an example shape of a piece at a portion where a through hole is formed.
Figure 4:
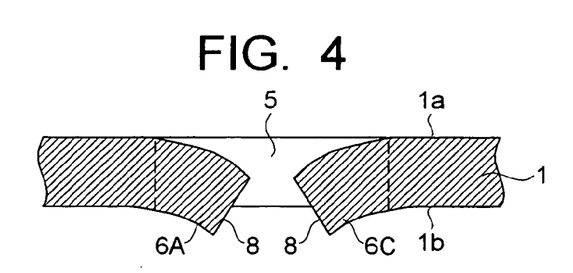
FIG. 4 is a view showing the piece shown in FIG. 3 on section.
Figure 5:
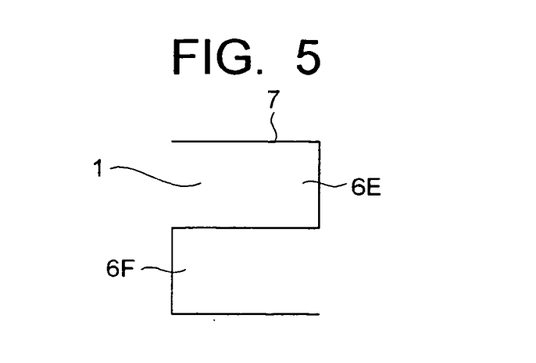
FIG. 5 is a plan view showing another example shape of the piece at the portion where the through hole is formed.
Figure 6:
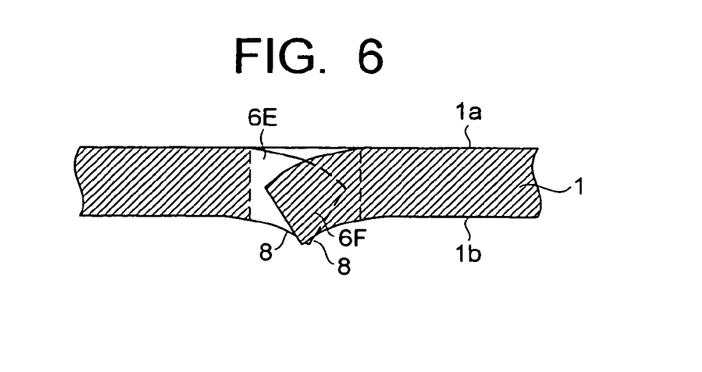
FIG. 6 is a view showing the piece shown in FIG. 5 on section.

The number of the piece 6 per a single through hole 5 is not limited to one and two or more is also acceptable. FIGS. 1A to 1D and FIGS. 2A to 2D show a state where the single piece 6 having a rectangular planar shape is formed. The piece 6 is separated from the sheet-shaped insulating substrate 1 by the cut 7 formed to have a horseshoe shape. To the piece 6, as shown in FIG. 3 and FIG. 4, fan-shaped pieces 6A to 6D formed by dividing a circular portion into four along diameters orthogonal to each other may be applied. As described above, the cut 7 may be formed in the sheet-shaped insulating substrate 1 in advance to obtain the fan-shaped pieces 6A to 6D in the inserting portion of the punch 4. The cut 7 formed in the sheet-shaped insulating substrate 1 may be one like a groove that is formed toward a part in the depth direction of the sheet-shaped insulating substrate 1. The cut 7 formed in the sheet-shaped insulating substrate 1 can adopt various shapes such as to obtain two rectangular pieces 6E, 6F formed alternately, as shown in FIG. 5 and FIG. 6.

Further, when a plurality of pieces 6 is applied to a single through hole 5, their deforming directions are not necessary be the same, and the pieces 6 may be deformed in the directions different from each other. In FIG. 5 and FIG. 6, the two rectangular pieces 6E and 6F are deformed downward, respectively. The deforming direction of the two rectangular pieces 6E, 6F is not limited thereto, and for example, the rectangular piece 6E may be deformed downward while the rectangular piece 6F is deformed upward. The same also applies to the fan-shaped pieces 6A to 6D shown in FIG. 3 and FIG. 4.

The number of the through hole 5 formed for the single land 3 may be one, however, preferably, plural number, for example, two to five through holes 5 are formed for the single land 3 for the purpose of connecting between both the front and rear faces more surely. The size of the through hole 5 is preferably within the range from 30 to 400 μm. Here, the size of the through hole 5 is defined to indicate the size of the punch 4 inserted through the sheet-shaped insulating substrate 1. For instance, when the punch 4 has a tip of a circular column shape, the size represents the diameter of the circular section; and when the punch 4 has a tip of a rectangular column shape, the size represents the diagonal of the rectangular section.

When the size of the through hole 5 is below 30 μm, a continuity failure tends to be caused at the connecting portion between both the front and rear faces by the metal plating layer. On the other hand, when the size of the through hole 5 exceeds 400 μm, the filling performance of the metal plating layer lowers. In other words, possibly, the inside of the through hole 5 is not sufficiently filled with the metal plating layers, and then the reliability of the connecting portion may degrade. In any case, the reliability in electrical connection between both the front and rear faces by the through hole 5 degrades. More preferably, the size of the through hole 5 is within the range from 50 to 200 μm. When forming a plurality of through holes 5 for the single land 3, the sizes of the through holes 5 are appropriately adjusted in accordance with the number to form or so forth.

Figure 2C:
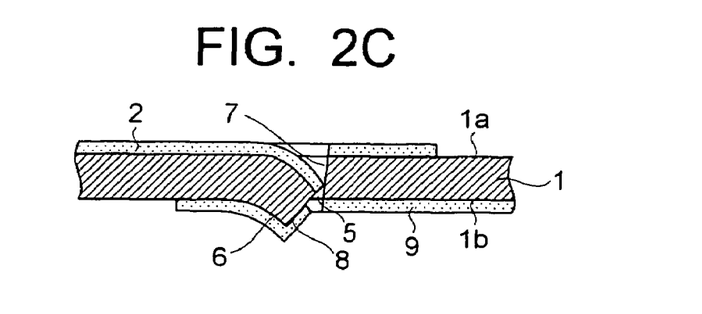

Subsequently, as shown in FIG. 1C and FIG. 2C, the second plating foundation layer 9 having a desired wiring pattern is formed on the rear face side of the sheet-shaped insulating substrate 1 having the through hole 5 formed therein. The second plating foundation layer 9 has a land similar to that of the first plating foundation layer 2. The forming step of the second plating foundation layer 9 is performed by applying a printing step such as the electrophotographic printing as in the first plating foundation layer 2. At this time, the second plating foundation layer 9 is formed on a part of the piece 6 as well. Specifically, the second plating foundation layer 9 is formed on a rear side 8 of the piece 6. The side surface 8 of the piece 6 is, as previously described, a face formed along the cut 7.

Figure 2D:
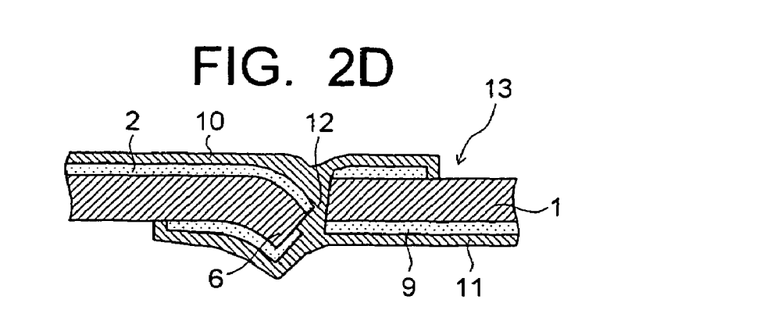

After that, as shown in FIG. 1D and FIG. 2D, the electroless plating is performed to the sheet-shaped insulating substrate 1 having the first and second plating foundation layers 2, 9 to thereby form first and second wiring layers 10, 11 composed of the metal plating layer on the first and second plating foundation layers 2, 9, respectively. At this time, with the piece 6 having the plating foundation layers 2, 9, and existing in the through hole 5, a metal plating layer 12 is precipitated so as to connect the first and second plating foundation layers 2, 9 at the inside of the through hole 5. By adjusting the thickness(es) of the sheet-shaped insulating substrate 1 and/or the metal plating layers (first and second wiring layers 10, 11), the size of the through hole 5 and the like, it is possible to electrically connect between the first and second wiring layers with the metal plating layer 12 formed inside the through hole 5.

As described above, by performing the electroless plating to the sheet-shaped insulating substrate 1 having the through hole 5 formed so that the piece 6 remains, it is possible to obtain a wiring substrate 13 having the connecting portion electrically connecting between both the front and rear faces of the sheet-shaped insulating substrate 1, namely the first and second wiring layers 10, 11, by the metal plating layer 12 formed in the through hole 5. The step required to form such a connecting portion is only to add a step of inserting the punch 4 into the sheet-shaped insulating substrate 1 having the first plating foundation layer 2 to the general step of forming the wiring layers 10, 11, so that it is possible to connect between both the front and rear faces of the wiring substrate 13 simply.

Further, the metal plating layer 12 is precipitated by sandwiching the plating foundation layers 2, 9 on the piece 6 of which part exists in the through hole 5, so that the connectivity and filing performance with the metal plating layer 12 in the through hole 5 is improved. Above all, the plating foundation layer 9 formed on the side surface 8 of the piece 6 plays a role of reducing the distance between the plating foundation layers 2, 9 in addition to that a part, at least, thereof exists in the through hole 5. Backed by this, the connectivity and filling performance of the metal plating layer 12 in the through hole 5 can be improved. In other words, the reliability in electrical connection between the first and second wiring layers 10, 11 by the metal plating layer 12 formed in the through hole 5 can be increased.

With these, a highly reliable connection of both the faces can be obtained by the simple step without losing characteristics backed by the printing method such as low cost. Specifically, the wiring substrate 13 with high reliability in the both-faces connection can be provided at low cost. Note that the front faces of the wiring layers 10, 11 may be covered by insulating layers by applying a similar printing step. The printing method such as the electrophotographic method (electrostatic printing) may be applied to form the insulating layer.

Here, for the metal plating being a material to form the first and second wiring layers 10, 11, Cu, Ag, Au, an alloy containing these, and the like can be adopted. The characteristics of the respective metals and Al are as follows. Cu has a tensile strength of 21.7 Mpa and an elongation of 50%, Ag has a tensile strength of 12.7 Mpa and an elongation of 48%, Au has a tensile strength of 13.3 Mpa and an elongation of 45%, and Al has a tensile strength of 4.76 Mpa and an elongation of 60%. Since Al is softer than Cu, Ag, Au and superior in ductility, it allows a mechanical connecting step such as caulking to connect both the faces, however, such a connecting step is not applicable to Cu, Ag, Au. For the connection between the wiring layers 10, 11 composed of the above-described metals, the above-described connecting portion is specifically effective.

Figure 7A:
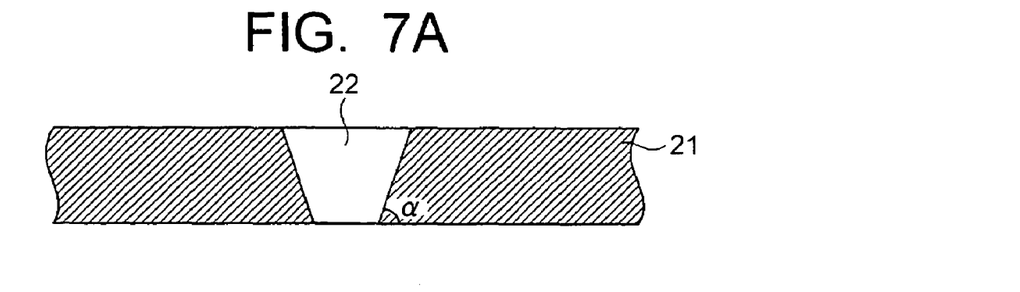
FIG. 7A, FIG. 7B, FIG. 7C, and FIG. 7D are sectional views showing a production process of a wiring substrate according to a second embodiment of the present invention.

A second embodiment according to the present invention will be described with reference to FIGS. 7A to 7D. FIGS. 7A to 7D are sectional views showing a production process of a wiring substrate according to the second embodiment of the present invention. First, as shown in FIG. 7A, a tilting through hole 22 is formed in a sheet-shaped insulating substrate 21. Here, the tilting through hole 22 indicates a through hole having an internal wall surface tilting (tilting angle α) from the vertical direction with respect to a surface of the substrate. FIGS. 7A to 7D show the through hole 22 of a tapered shape in which an upper-side diameter is larger than a lower-side diameter, as an example of the tilting through hole. Note that, for the sheet-shaped insulating substrate 21, a sheet-shaped member of the same material and thickness as of the first embodiment is preferably used.

Figure 7B:
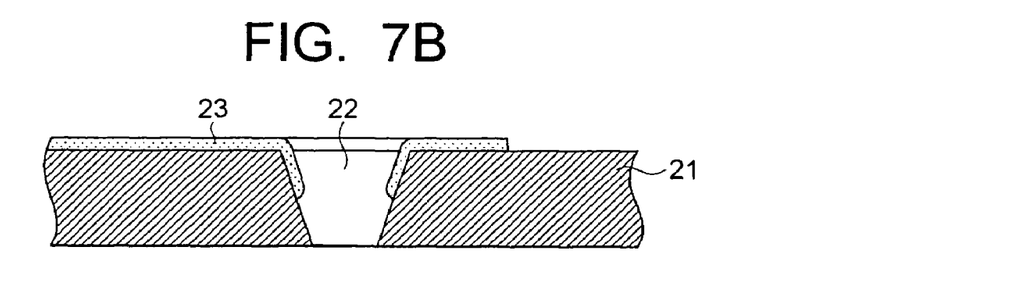

Subsequently, as shown in FIG. 7B, a first plating foundation layer 23 is formed on the surface of the sheet-shaped insulating substrate 21 having the tapered through hole 22. The forming step and structure of the first plating foundation layer 23 are assumed to be the same as of the first embodiment. The same applies to the second plating foundation layer 25. The tapered through hole 22 has a tapered internal wall surface capable of receiving toners, ink, or the like forming the first plating foundation layer 23, and there by the first plating foundation layer 23 is formed to cover at least a part of the internal wall surface. In order to obtain the function as described above, the tilting angle α of the tapered through hole 22 is preferably within the range from 30 degrees to 80 degrees. The size (diameter of the large-diameter portion) of the tapered through hole 22 is preferably within the range from 50 to 300 μm.

The tilting angle α of the tapered through hole 22 over 80 degrees is, possibly, unable to receive the toner, ink, or the like forming the plating foundation layer 23 in good condition. Meanwhile, although it depends on the size of the tapered through hole 22, the tilting angle α below 30 degrees possibly causes the connection reliability or the wiring density, or the like to lower. Meanwhile, the size of the tapered through hole 22 below 50 μm causes reliability in electrical connection by the metal plating layer filled inside thereof to lower. Meanwhile, the size of the through hole 22 over 300 μm possibly causes the filling performance of the metal plating layer to lower.

Figure 8A:
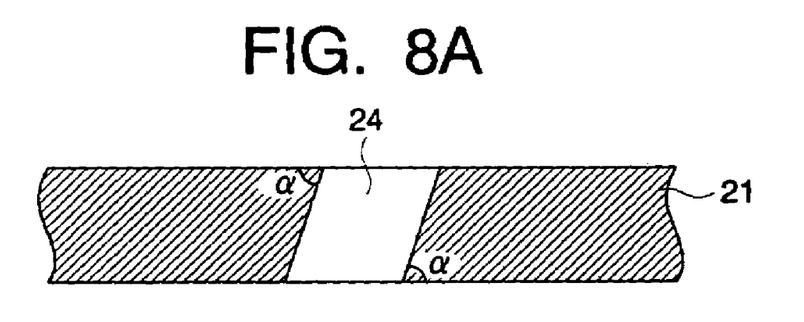
FIG. 8A and FIG. 8B are sectional views showing a modification example of the production process of the wiring substrate shown in FIG. 7A, FIG. 7B, FIG. 7C, and FIG. 7D.

The tapered through hole 22 is formed by applying, for example, laser machining. At this time, the tapered through hole 22 having a desired tilting angle α can be obtained by controlling output, time, focal point of a laser, or the like. Note that, differently from the first embodiment, the tapered through hole 22 according to the second embodiment is formed by performing a holing processing not to leave the sheet-shaped insulating substrate 21. The tilting through hole is not limited to the tapered through hole 22, and a through hole 24 (totally-tilting through hole) formed at a tilting angle as shown for example in FIG. 8A is also acceptable. The tilting angle α and size (inside diameter of the through hole) of the totally-tilting through hole 24 are preferably the same as of the tapered through hole 22. In addition, the number of the tapered through hole(s) 22 or the totally-tilting through hole(s) 24 to be formed is preferably two or more for the single land, as in the case of the first embodiment.

Figure 7C:
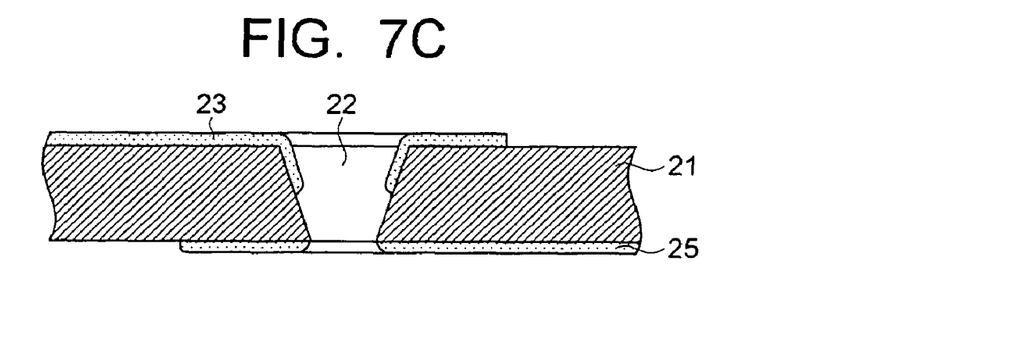
Figure 8B:
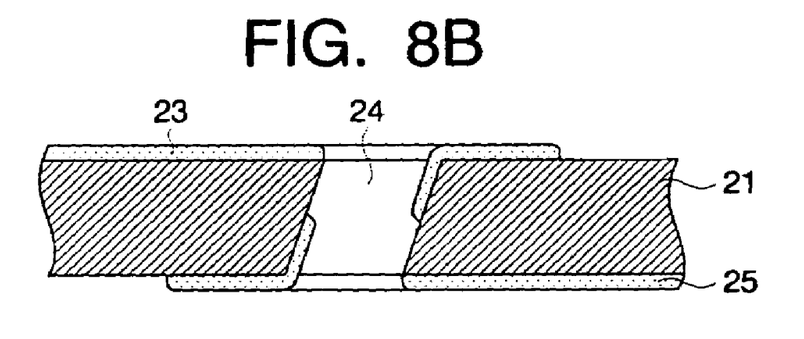

Subsequently, as shown in FIG. 7C, a second plating foundation layer 25 having a desired wiring pattern is formed by printing on the rear face side of the sheet-shaped insulating substrate 21. At this time, in the case of the sheet-shaped insulating substrate 21 having the totally-tilting through hole 24, as shown in FIG. 8B, concurrently with the formation of the second plating foundation layer 25 having the desired wiring pattern, a part of the internal wall surface of the totally-tilting through hole is covered by the second plating foundation layer 25. Specifically, when the first plating foundation layer 23 is formed, the internal wall surface of the tapered through hole 22 is partly covered with the plating foundation layer 23 over the entire periphery thereof. Meanwhile, in the case of the totally-tilting through hole 24, the entire periphery of (a part of) the internal wall surface is sequentially covered with the plating foundation layers 23, 25 when forming the plating foundation layers 23, 25 on both the front and rear faces. In this manner, in any of the tapered through hole 22 and totally-tilting through hole 24, the same effect can be obtained.

Figure 7D:
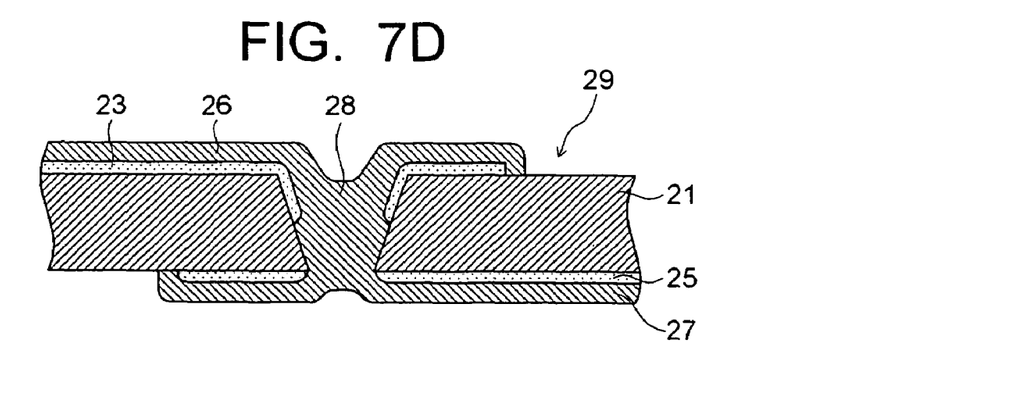

After that, as shown in FIG. 7D, the electroless plating is performed to the sheet-shaped insulating substrate 21 having the first and second plating foundation layers 23, 25 to thereby form first and second wiring layers 26, 27 composed of the metal plating layer on the first and second plating foundation layers 23, 25, respectively. At this time, the plating foundation layers 23, 25 partly exist on the internal wall surfaces of the tapered through hole 22 and totally-tilting through hole 24 and these serve as plating catalysts, so that metal plating layers 28 are precipitated respectively to be formed or filled inside the through holes 23, 24.

By appropriately adjusting the thicknesses of the sheet-shaped insulating substrate 21 and the metal plating layers (first and second wiring layers 26, 27), the size of the through holes 22, 24, and the like, it is possible to electrically connect between the first and second wiring layers 26, 27 by the metal plating layer 28 filled in the through holes 22, 24. When the thicknesses of the metal plating layer (the respective thicknesses of the first and second wiring layers 26, 27) is set to T, and the thicknesses of the sheet-shaped insulating substrate 21 is set to t, the thicknesses T of the metal plating layers are preferably set to be larger than ½ of the thicknesses t of the sheet-shaped insulating substrate 21 (T>½t).

As described above, by performing the electroless plating to the sheet-shaped insulating substrate 21 having the tilting through hole such as the tapered through hole 22 or the totally-tilting through hole 24, it is possible to obtain a wiring substrate 29 having the connecting portion electrically connecting between both the front and rear faces of the sheet-shaped insulating substrate 21, namely the first and second wiring layers 26, 27, by the metal plating layer 28 filled in the through holes 22, 24. The step required to form the connecting portion as described above is only to add a step of forming the tilting through hole to the general step of forming the wiring layers 26, 27, so that it is possible to connect between the front and rear faces of the wiring substrate 29 simply.

Further, the metal plating layer 28 is precipitated by sandwiching the plating foundation layers 23, 25 existing in the tilting through holes 22, 24, so that the filling performance of the through holes 22, 24 by the metal plating layer 28 is improved. In other words, the reliability in electrical connection between the first and second wiring layers 26, 27 by the metal plating layer 28 filled in the through holes 22, 24 can be increased. With these, a highly reliable connection of both the faces can be obtained by the simple step without losing characteristics backed by the printing method such as low cost. Specifically, the wiring substrate 29 with high reliability in the both-faces connection can be provided at low cost. Also, the second embodiment is effective when adopting Cu, Ag, Au, or the like for a formation material of the first and second wiring layers 26, 27.

Next, specific examples of the present invention and their evaluation results will be described.

EXAMPLES 1 to 5

First, as a toner containing metal particulates and for use in the electrophotographic printing, cresol novolac epoxy resin added and mixed with 50% copper powders by mass, which have a particle diameter of 0.7 μm in average, is prepared. With such toner containing metal particulates, the first plating foundation layer is formed by printing on the front face side of the sheet-shaped insulating substrate. As a sheet-shaped insulating substrate, a glass-epoxy sheet of a thickness of 50 μm (example 1), a polyimide sheet of a thickness of 25 μm (example 2), a polyimide sheet of a thickness of 50 μm (example 3), a polyimide sheet of a thickness of 75 μm (example 4), and a PET sheet of a thickness of 50 μm (example 5) are used. The printings of the toner containing metal particulates are performed by a copying machine for office use with 600 dpi resolution.

Subsequently, a through hole is formed in each sheet-shaped insulating substrate having the first plating foundation layer formed by printing by way of inserting a cross punch of a tip diameter of 200 μm thereinto. In examples 1 to 5, the through holes are formed for 18 lands, respectively.

Further, for each example, a sample in which a through hole is formed per a land, and a sample in which three through holes are formed per land are produced, respectively. Note that the observation of the portions where the through-holes are formed can confirm that every portion has the cut and the piece along the cut remains inside the through hole. Subsequently, the second plating foundation layer is formed by printing on the rear face side of the respective sheet-shaped insulating substrates each of which has the through-hole formed therein in the same manner as of the first plating foundation layer.

After that, the electroless copper plating (liquid temperature 30° C.×5 hours) is performed to the respective sheet-shaped insulating substrates to form the first and second wiring layers and the connecting portion to connect between these wiring layers. Over the respective wiring substrates obtained in the above-described manner, a check is made to know whether or not the respective connecting portions are electrically connected. The continuity test of the connecting portion is performed on each of the 18 lands. The results of the continuity test on the connecting portions will be shown in Table 1 by the number of lands that are electrically connected out of 18 lands.

TABLE 1

| | Sheet-shaped insulating substrate | | Number of through hole per land (piece) | Results of continuity test (number of connected land/total number of land) |
|---|---|---|---|---|
| | Material | Thickness (μm) | | |
| Example 1 | Glass-epoxy | 50 | 1 | 18/18 |
| | | | 3 | 18/18 |
| Example 2 | Polyimide | 25 | 1 | 18/18 |
| | | | 3 | 18/18 |
| Example 3 | Polyimide | 50 | 1 | 18/18 |
| | | | 3 | 18/18 |
| Example 4 | Polyimide | 75 | 1 | 14/18 |
| | | | 3 | 18/18 |
| Example 5 | PET | 50 | 1 | 18/18 |
| | | | 3 | 18/18 |

As is apparent from Table 1, even through unconnected through-hole connecting portions slightly exist in the wiring substrate in Example 4 using the polyimide sheet of a thickness of 75 μm in the case where the number of the through hole per land is one, other than that, it was possible to connect between the front and rear faces of the wiring substrates at their through-hole connecting portions in good condition. The electrical resistance values by the respective through-hole connecting portions were around 20 mΩ.

EXAMPLES 6 to 10

The through holes are formed with respect to the same sheet-shaped insulating substrate as in Examples 1 to 5 by applying laser machining. At this time, the tapered through holes are formed by controlling laser output. The tilting angle α of the tapered through hole is defined to be within the range from 30 degrees to 80 degrees. Apart therefrom, a totally-tilting through hole is formed by controlling the angle to process by the laser machining. The tilting angle α of the totally-tilting through hole is also defined to be within the range from 30 degrees to 80 degrees. Incidentally, for the respective sheet-shaped insulating substrates, that having the tapered through hole formed and that having the totally-tilting through hole formed are produced.

On the sheet-shaped insulating substrates having the tilting through holes as described above, the first and second plating foundation layers are formed sequentially by printing using the toner containing the same metal particulates as of Examples 1 to 5, respectively. After that, the electroless copper plating is performed to the respective sheet-shaped insulating substrates in the same manner as in Examples 1 to 5 to form the first and second wiring layers and through-hole connecting portion, respectively. The continuity test is performed to the respective wiring substrate thus obtained, and the results were favorable.

Note that the present invention is not limited to the above-described respective embodiments and is applicable to various types of wiring substrates in which the wiring layer is formed by lapping the plating foundation layer formed by printing and the metal plating layer on both the faces of the sheet-shaped insulating substrate and, at the same time, the connection between both the front and rear faces is made by the through hole, and to the manufacturing method thereof. The wiring substrates as described above and the manufacturing method thereof are also within the scope of the present invention. The embodiments according to the present invention may be extended or modified as long as it is within the technical spirit of the present invention, and the extended or modified embodiment is also within the technical scope of the present invention.

What is claimed is:

1. A manufacturing method of a wiring substrate, comprising:
   printing a first plating foundation layer on a front face of a sheet-shaped insulating substrate;
   forming a through hole connecting between the front face and rear face of the sheet-shaped insulating substrate by inserting a punch into the sheet-shaped insulating substrate having the first plating foundation layer to generate a cut in the sheet-shaped insulating layer while leaving a piece of the sheet-shaped insulating layer having the plating foundation layer and separated from the sheet-shaped insulating substrate along the cut while a part of the sheet-shaped insulating layer is continued from the sheet-shaped insulating substrate in a portion where the punch is inserted;
   printing a second plating foundation layer on the rear face of the sheet-shaped insulating substrate; and
   performing electroless plating to the plating foundation layers to form first and second wiring layers respectively composed of a metal plating layer on the first and second plating foundation layers, and to form the metal plating layer connecting between the first and second wiring layers in the through hole using the plating foundation layer on both obverse and reverse of the piece.

2. The manufacturing method of the wiring substrate as set forth in claim 1,
   wherein the cut is formed when the punch is inserted into the sheet-shaped insulating substrate.

3. The manufacturing method of the wiring substrate as set forth in claim 1,
   wherein the first and second plating foundation layers are formed by electrophotographic printing.

4. The manufacturing method of the wiring substrate as set forth in claim 1,
   wherein a plurality of the through holes are formed for the sheet-shaped insulating substrate having the first plating foundation layer.

5. The manufacturing method of the wiring substrate as set forth in claim 1,
   wherein the sheet-shaped insulating substrate has a thickness of 100 μm or below.

* * * * *